US006845472B2

(12) United States Patent
Walker et al.

(10) Patent No.: US 6,845,472 B2
(45) Date of Patent: Jan. 18, 2005

(54) MEMORY SUB-SYSTEM ERROR CLEANSING

(75) Inventors: William J. Walker, Houston, TX (US); John M. MacLaren, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 547 days.

(21) Appl. No.: 09/769,956

(22) Filed: Jan. 25, 2001

(65) Prior Publication Data

US 2001/0029592 A1 Oct. 11, 2001

Related U.S. Application Data

(60) Provisional application No. 60/177,989, filed on Jan. 25, 2000.

(51) Int. Cl.[7] ............................................... G06F 11/00
(52) U.S. Cl. .......................................... 714/42; 714/54
(58) Field of Search .............................. 714/42, 5, 6, 7, 714/29, 54, 710, 718, 763, 764

(56) References Cited

U.S. PATENT DOCUMENTS

| 5,267,242 A | * | 11/1993 | Lavallee et al. ................ 714/7 |
| 5,313,626 A | | 5/1994 | Jones et al. .................. 395/575 |
| 5,331,646 A | | 7/1994 | Krueger et al. ............. 371/40.1 |
| 5,367,669 A | | 11/1994 | Holland et al. ............. 395/575 |
| 5,511,078 A | * | 4/1996 | Barucchi et al. ............. 714/763 |
| 5,768,560 A | * | 6/1998 | Lieberman et al. .......... 711/167 |
| 6,076,183 A | * | 6/2000 | Espie et al. .................. 714/764 |
| 6,098,132 A | | 8/2000 | Olarig et al. ................ 710/103 |
| 6,101,614 A | * | 8/2000 | Gonzales et al. ............... 714/6 |
| 6,223,301 B1 | | 4/2001 | Santeler et al. ................ 714/6 |
| 6,279,128 B1 | * | 8/2001 | Arnold et al. ................. 714/49 |

* cited by examiner

*Primary Examiner*—Dieu-Minh Le (57) ABSTRACT

A system and technique for detecting data errors in a memory device. More specifically, data errors in a memory device are detected by initiating an internal READ command or cleansing operation from a set of logic which is internal to the memory system in which the memory devices reside. Rather than relying on a READ command to be issued from an external device, via a host controller, the cleansing logic initiates a cleansing routine in response to an event such as an operator instruction or a periodic schedule. By implementing the cleansing operation, the system does not rely on external READ commands to verify data integrity. Further, a monitoring device is coupled between the cleansing logic and a memory scheduler. The monitoring device provides a feed back mechanism from which to vary the frequency of certain memory requests such as the cleansing and scrubbing operations. The cleansing routine may rely on typical ECC error logging mechanisms and may be used in a RAID memory architecture. Further, the cleansing routine may be used in conjunction with other error logging and correction logic, as well as scrubbing logic.

85 Claims, 6 Drawing Sheets

MEMORY SUB-SYSTEM ERROR CLEANSING

CROSS-REFERENCE TO RELATED APPLICATION

The present application claims priority under 35 U.S.C § 119(e) to provisional application 60/177,989 filed on Jan. 25, 2000.

BACKGROUND OF THE INVENTION

1. Field of the Invention

The present invention relates generally to memory protection, and more specifically to a technique for detecting errors in a memory device.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Semiconductor memory devices used in computer systems, such as dynamic random access memory (DRAM) devices, generally comprise a large number of capacitors which store binary data in each memory device in the form of a charge. These capacitors are inherently susceptible to errors. As memory devices get smaller and smaller, the capacitors used to store the charges also become smaller thereby providing a greater potential for errors.

Memory errors are generally classified as "hard errors" or "soft errors." Hard errors are generally caused by issues such as poor solder joints, connector errors, and faulty capacitors in the memory device. Hard errors are reoccurring errors which generally require some type of hardware correction such as replacement of a connector or memory device. Soft errors, which cause the vast majority of errors in semiconductor memory, are transient events wherein extraneous charged particles cause a change in the charge stored in one of the capacitors in the memory device. When a charged particle, such as those present in cosmic rays, comes in contact with the memory circuit, the particle may change the charge of one or more memory cells, without actually damaging the device. Because these soft errors are transient events, generally caused by alpha particles or cosmic rays for example, the errors are not generally repeatable and are generally related to erroneous charge storage rather than hardware errors. For this reason, soft errors, if detected, may be corrected by rewriting the erroneous memory cell with correct data. Uncorrected soft errors will generally result in unnecessary system failures. Further, soft errors may be mistaken for more serious system errors and may lead to the unnecessary replacement of a memory device. By identifying soft errors in a memory device, the number of memory devices which are actually physically error free and are replaced due to mistaken error detection can be mitigated, and the errors may be easily corrected before any system failures occur.

Memory errors can be categorized as either single-bit or multi-bit errors. A single bit error refers to an error in a single memory cell. Single-bit errors can be detected and corrected by standard Error Code Correction (ECC) methods. However, in the case of multi-bit errors, which affect more than one bit, standard ECC methods may not be sufficient. In some instances, ECC methods may be able to detect multi-bit errors, but not correct them. In other instances, ECC methods may not even be sufficient to detect the error. Thus, multi-bit errors must be detected and corrected by a more complex means since a system failure will typically result if the multi-bit errors are not detected and corrected.

Regardless of the classification of memory error (hard/soft, single-bit/multi-bit), the current techniques for detecting the memory errors have several drawbacks. Typical error detection techniques typically rely on READ commands being issued by requesting devices, such as a peripheral disk drive. Once a READ command is issued to a memory sector, a copy of the data is read from the memory sector and tested for errors en route to delivery to the requesting device. Because the testing of the data in a memory sector only occurs if a READ command is issued to that sector, seldom accessed sectors may remain untested indefinitely. Harmless single-bit errors may align over time resulting in uncorrectable multi-bit errors. Once a READ request is finally issued to a seldom accessed sector, previously correctable errors may have evolved into uncorrectable errors thereby causing unnecessary data corruption or system failures. Early error detection may significantly reduce the occurrences of uncorrectable errors and prevent future system failures.

Further, in redundant memory systems, undetected memory errors may pose an additional threat. Certain operations, such as hot-plug events, may require that the system transition from a redundant to a non-redundant state. In a non-redundant state, memory errors which were of little concern during a redundant mode of operation, may become more significant since errors that were correctable during a redundant mode of operation may no longer be correctable while the system operates in a non-redundant state.

For those systems which may exist and may not rely on memory READ requests from external devices for memory error detection, there is an added issue of scheduling memory error detection cycles. Because system memory access and system utilization may be at a premium, error detection techniques may slow normal processing. This may be particularly true when there is a lot of activity through the memory system. At peak activity times, priority events, such as memory READ requests and memory WRITE requests may be disadvantageously slowed by the implementation of error detection cycles.

The present invention may address one or more of the concerns set forth above.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
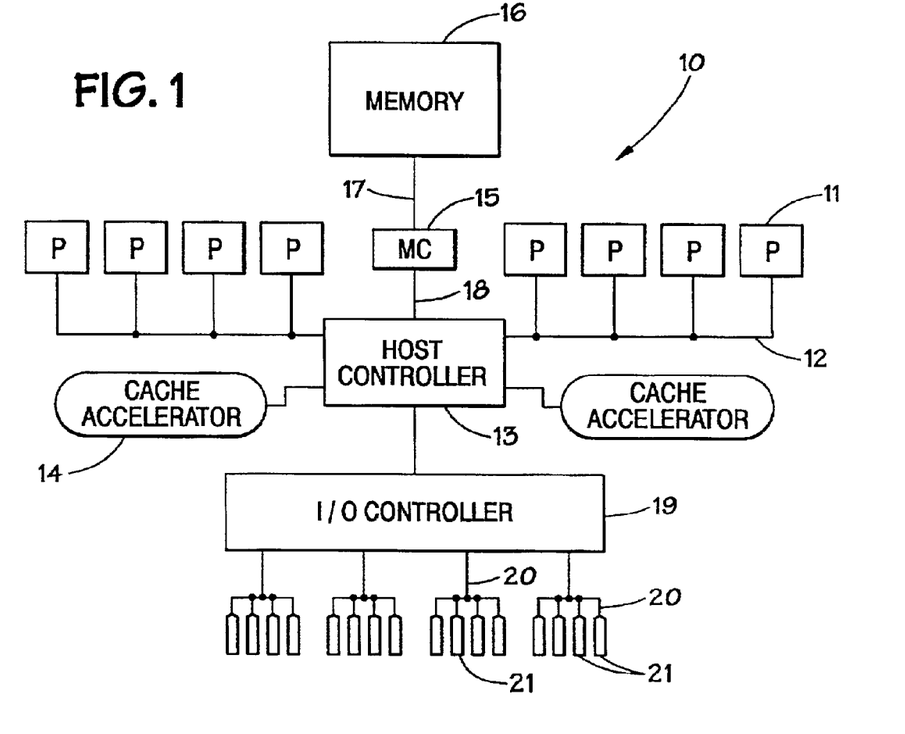
FIG. 1 is a block diagram illustrating an exemplary computer system.

Turning now to the drawings, and referring initially to FIG. 1, a multiprocessor computer system, for example a Proliant 8500 PCI-X from Compaq Computer Corporation, is illustrated and designated by the reference numeral 10. In this embodiment of the system 10, multiple processors 11 control many of the functions of the system 10. The processors 11 may be, for example, Pentium, Pentium Pro, Pentium HI Xeon (Slot-2), or Pentium III processors available from Intel Corporation. However, it should be understood that the number and type of processors are not critical to the technique described herein and are merely being provided by way of example.

Typically, the processors 11 are coupled to a processor bus 12. As instructions are sent and received by the processors 11, the processor bus 12 transmits the instructions and data between the individual processors 11 and a host controller 13. The host controller 13 serves as an interface directing signals between the processors 11, cache accelerators 14, a memory controller 15 (which may be comprised of one or more memory control devices as discussed with reference to FIGS. 5 and 6), and an I/O controller 19. Generally, ASICs are located within the host controller 13. The host controller 13 may include address and data buffers, as well as arbitration and bus master control logic. The host controller 13 may also include miscellaneous logic, such as error detection and correction logic. Furthermore, the ASICs in the host controller may also contain logic specifying ordering rules, buffer allocation, specifying transaction type, and logic for receiving and delivering data. When the data is retrieved from the memory 16, the instructions are sent from the memory controller 15 via a memory bus 17. The memory controller 15 may comprise one or more suitable standard memory control devices or ASICs.

The memory 16 in the system 10 is generally divided into groups of bytes called cache lines. Bytes in a cache line may comprise several variable values. Cache lines in the memory 16 are moved to a cache for use by the processors 11 when the processors 11 request data stored in that particular cache line.

The host controller 13 is coupled to the memory controller 15 via a memory network bus 18. As mentioned above, the host controller 13 directs data to and from the processors 11 through the processor bus 12, to and from the memory controller 15 through the network memory bus 18, and to and from the cache accelerator 14. In addition, data may be sent to and from the I/O controller 19 for use by other systems or external devices. The I/O controller 19 may comprise a plurality of PCI-bridges, for example, and may include counters and timers as conventionally present in personal computer systems, an interrupt controller for both the memory network and I/O buses, and power management logic. Further, the I/O controller 19 is coupled to multiple I/O buses 20. Finally, each I/O bus 20 terminates at a series of slots or I/O interface 121.

Generally, a transaction is initiated by a requestor, e.g., a peripheral device, via the I/O interface 21. The transaction is then sent to one of the I/O buses 20 depending on the peripheral device utilized and the location of the I/O interface 21. The transaction is then directed towards the I/O controller 19. Logic devices within the I/O controller 19 generally allocate a buffer where data returned from the memory 16 may be stored. Once the buffer is allocated, the transaction request is directed towards the processor 11 and then to the memory 16. Once the requested data is returned from the memory 16, the data is stored within a buffer in the I/O controller 19. The logic devices within the I/O controller 19 operate to read and deliver the data to the requesting peripheral device such as a tape drive, CD-ROM device or other storage device.

Figure 2:
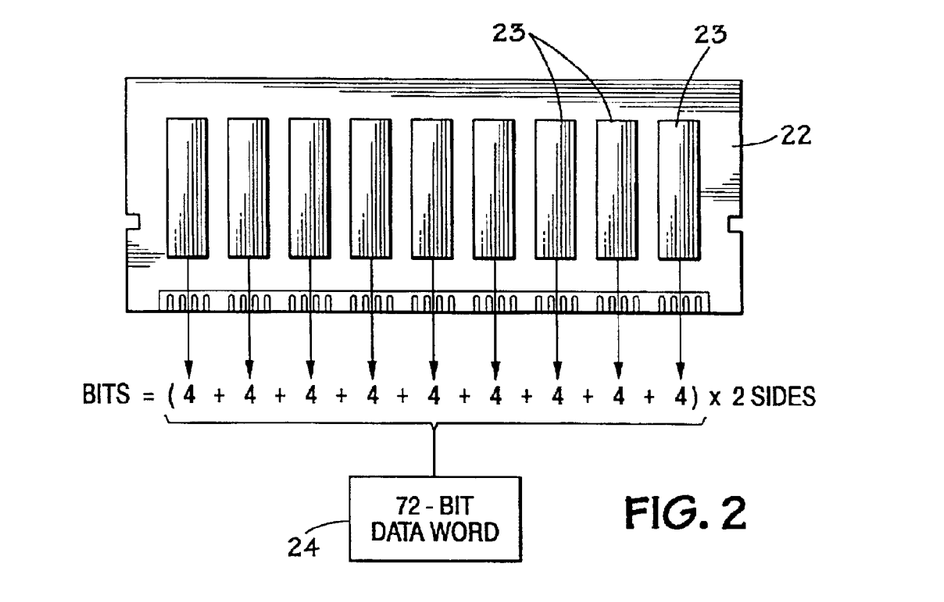
FIG. 2 illustrates an exemplary memory device used in the present system.

A system 10, such as a computer system, generally comprises a plurality of memory modules, such as Dual Inline Memory Modules (DIMMs). A standard DIMM may include a plurality of memory devices such as Dynamic Random Access Memory Devices (DRAMs). In an exemplary configuration, a DIMM may comprise nine memory devices on each side of the DIMM 22. FIG. 2 illustrates one side of a DIMM 22 which includes nine DRAMs 23. The second side of the DIMM 22 may be identical to the first side and may comprise nine additional DRAM devices (not shown). Each DIMM 22 access generally accesses all DRAMs 23 on the DIMM 22 to produce a data word. For example, a DIMM 22 comprising ×4 DRAMs 23 (DRAMs passing 4-bits with each access) will produce 72-bit data words. System memory is generally accessed by CPUs and I/O devices as a cache line of data. A cache line generally comprises several 72-bit data words. Thus, each DIMM 22 accessed on a single memory bus provides a cache line of 72-bit data words 24.

Each of the 72 bits in each of the data words 24 is susceptible to soft errors. Different methods of error detection may be used for different memory architectures. The present method and architecture incorporates a Redundant Array of Industry Standard DIMMs (RAID). As used herein, RAID memory refers to a "4+1 scheme" in which a parity word is created using an XOR module such that any one of the four data words can be re-created using the parity word if an error is detected in one of the data words. Similarly, if an error is detected in the parity word, the parity word can be re-created using the four data words. By using the present RAID memory architecture, not only can multi-bit errors be easily detected and corrected, but it also provides a system in which the memory module alone or the memory module and associated memory controller can be removed and/or replaced while the system is running (i.e. the memory modules and controllers are hot-pluggable).

Figure 3:
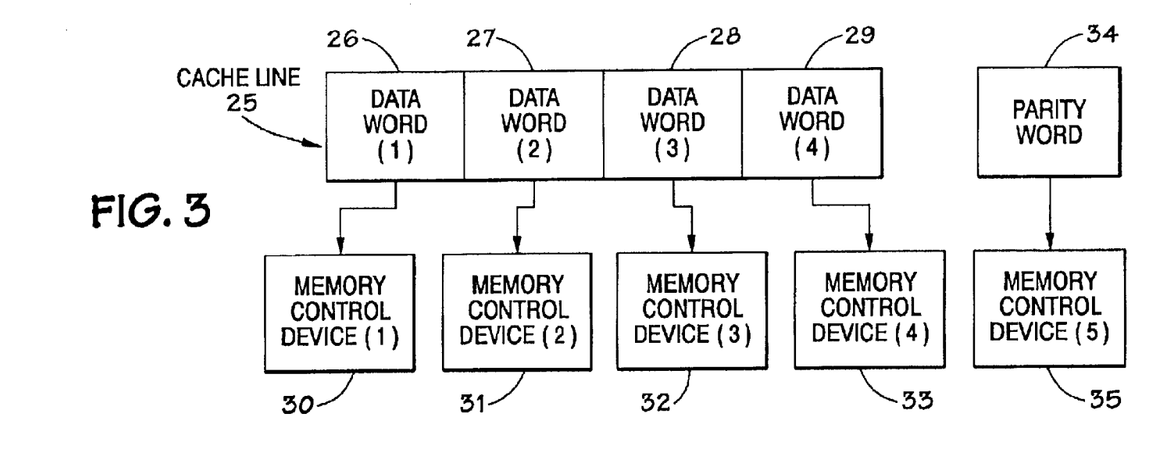
FIG. 3 generally illustrates a cache line and memory controller configuration in accordance with the present technique.

FIG. 3 illustrates one implementation of RAID memory. RAID memory stripes a cache line of data 25 such that each of the four 72-bit data words 26, 27, 28, and 29 is transmitted through a separate memory control device 30, 31, 32, and 33. A fifth parity data word 34 is generated from the original cache line 25. Each parity word 34 is also transmitted through a separate memory control device 35. The generation of the parity data word 34 from the original cache line 25 of data words 26, 27, 28, and 29 can be illustrated by way of example. For simplicity, four-bit data words are illustrated. However, it should be understood that these principals are applicable to 72-bit data words, as in the present system, or any other useful word lengths. Consider the following four data words:

DATA WORD 1: 1 0 1 1
DATA WORD 2: 0 0 1 0
DATA WORD 3: 1 0 0 1
DATA WORD 4: 0 1 1 1

A parity word can be either even or odd. To create an even parity word, common bits are simply added together. If the sum of the common bits is odd, a "1" is placed in the common bit location of the parity word. Conversely, if the sum of the bits is even, a zero is placed in the common bit location of the parity word. In the present example, the bits may be summed as follows:

```
DATA WORD 1:   1  0  1  1
DATA WORD 2:   0  0  1  0
DATA WORD 3:   1  0  0  1
DATA WORD 4:   0  1  1  1
               ─────────────
               2  1  3  3

Parity Word:   0  1  1  1
```

When summed with the four exemplary data words, the parity word 0111 will provide an even number of active bits (or "1's") in every common bit. This parity word can be used to re-create any of the data words (1–4) if a soft error is detected in one of the data words as further explained with reference to FIG. 4.

Figure 4:
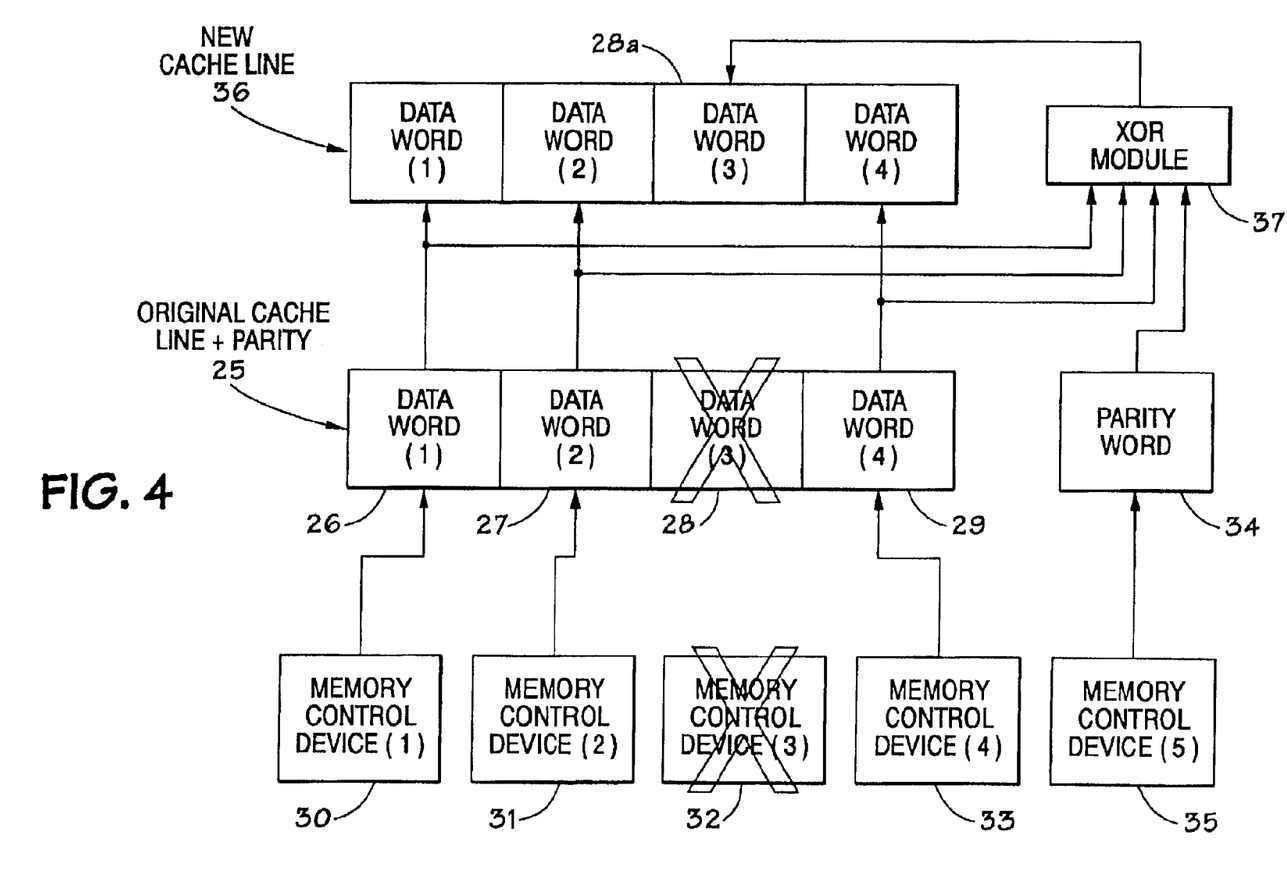
FIG. 4 generally illustrates the implementation of a RAID memory system to recreate erroneous data words.

FIG. 4 illustrates the re-creation of a data word in which a soft error has been detected in a RAID memory system. As in FIG. 3, the original cache line 25 comprises four data words 26, 27, 28, and 29 and a parity word 34. Further, the memory control device 30, 31, 32, 33, and 35 corresponding to each data word and parity word are illustrated. In this example, a data error has been detected in the data word 28. A new cache line 36 can be created using data words 26, 27, and 29 along with the parity word 34 using an exclusive-OR (XOR) module 37. By combining each data word 26, 27, 29 and the parity word 34 in the XOR module 37, the data word 28 can be re-created. The new and correct cache line 36 thus comprises data words 26, 27, and 29 copied directly from the original cache line 25 and data word 28a (which is the re-created data word 28) which is produced by the XOR module 37 using the error-free data words (26, 27, 29) and the parity word 34. It should also be clear that the same process may be used to re-create a parity word 34 if an error is detected therein using the four error-free data words.

Similarly, if the memory control device 32, which is associated with the data word 28, is removed during operation (i.e. hot-plugging) the data word 28 can similarly be re-created. Thus, any single memory control device can be removed while the system is running or any single memory control device can return a bad data word and the data can be re-created from the other four memory words using an XOR module.

Figure 5:
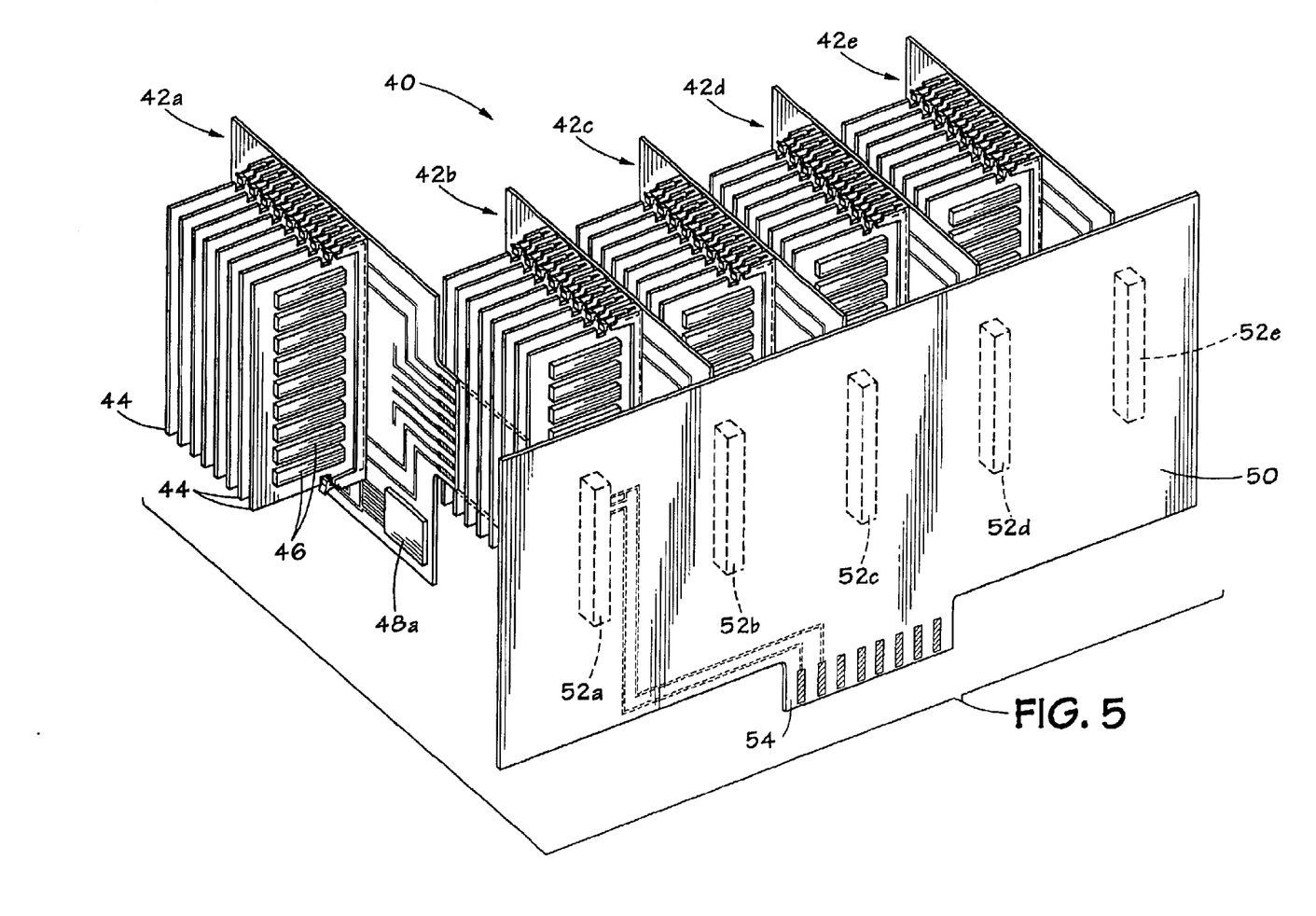
FIG. 5 illustrates an exemplary memory sub-system in accordance with the present technique.

FIG. 5 illustrates one embodiment of a memory sub-system 40, which incorporates a redundant (4+1) scheme. The memory sub-system 40 comprises five memory cartridges 42a–e. Memory cartridge 42e, for example, may be used for parity storage. The memory cartridge 42a includes eight DIMMs 44 mounted thereon. Each DIMM 44 includes nine memory devices, such as DRAMs 46 on each side of the DIMM substrate. (FIG. 5 illustrates only one side of the DIMM 44.) Further, the memory cartridge 44a has a memory control device 48a mounted thereon. It should be understood that each memory cartridge 42a–e includes a plurality of DIMMs 44 and a corresponding memory control device 48. The memory cartridges 42a–e may be mounted on a memory system board 50 via connectors 52a–e to create the memory sub-system 40. The memory sub-system 40 can be incorporated into a computer system via an edge connector 54 or by any suitable means of providing a data path from the computer system to the memory storage devices 46. It should be evident that each of the memory cartridges 42a–e may be removed (hot-plugged) from the memory sub-system 40. By removing a memory cartridge such as memory cartridge 44a from the memory sub-system 40, the computer system will transition from a redundant mode of operation (implementing the fifth memory cartridge) to a non-redundant state. When transitioning from a redundant to a non-redundant mode of operation during a hot-plug memory event, it may be advantageous to verify that no errors exist in the remaining memory cartridges 42b–e. Thus, immediately proceeding the removal of the memory cartridge 42a, a verify procedure may be advantageously implemented.

Further, a cleansing procedure may be advantageous in checking for memory errors in certain areas of memory which may sit idle for an extended period of time, allowing accumulation of errors or the growth of a single bit error to an uncorrectable multi-bit error. The cleansing procedure is implemented through a piece of logic which may reside in the memory sub-system 40. The cleansing logic can be programmed to check a specific region of memory such as the contents of a single memory cartridge 42a–e or to test the validity of the entire memory. The cleansing procedure relies on the normal ECC and error logging mechanisms to validate the health of the memory sub-system 40. The cleansing routine may be exercised by an operator instruction, as part of a sequence of memory operations (such as a hot-plug event), or based on a predetermined schedule. Simply put, the cleansing logic will read a defined memory region. If errors are detected they may be recorded and corrected, as further discussed below with reference to FIG. 6. The cleansing logic may reside in each memory controlled device 48a–e or on the memory system board 50.

Figure 6:
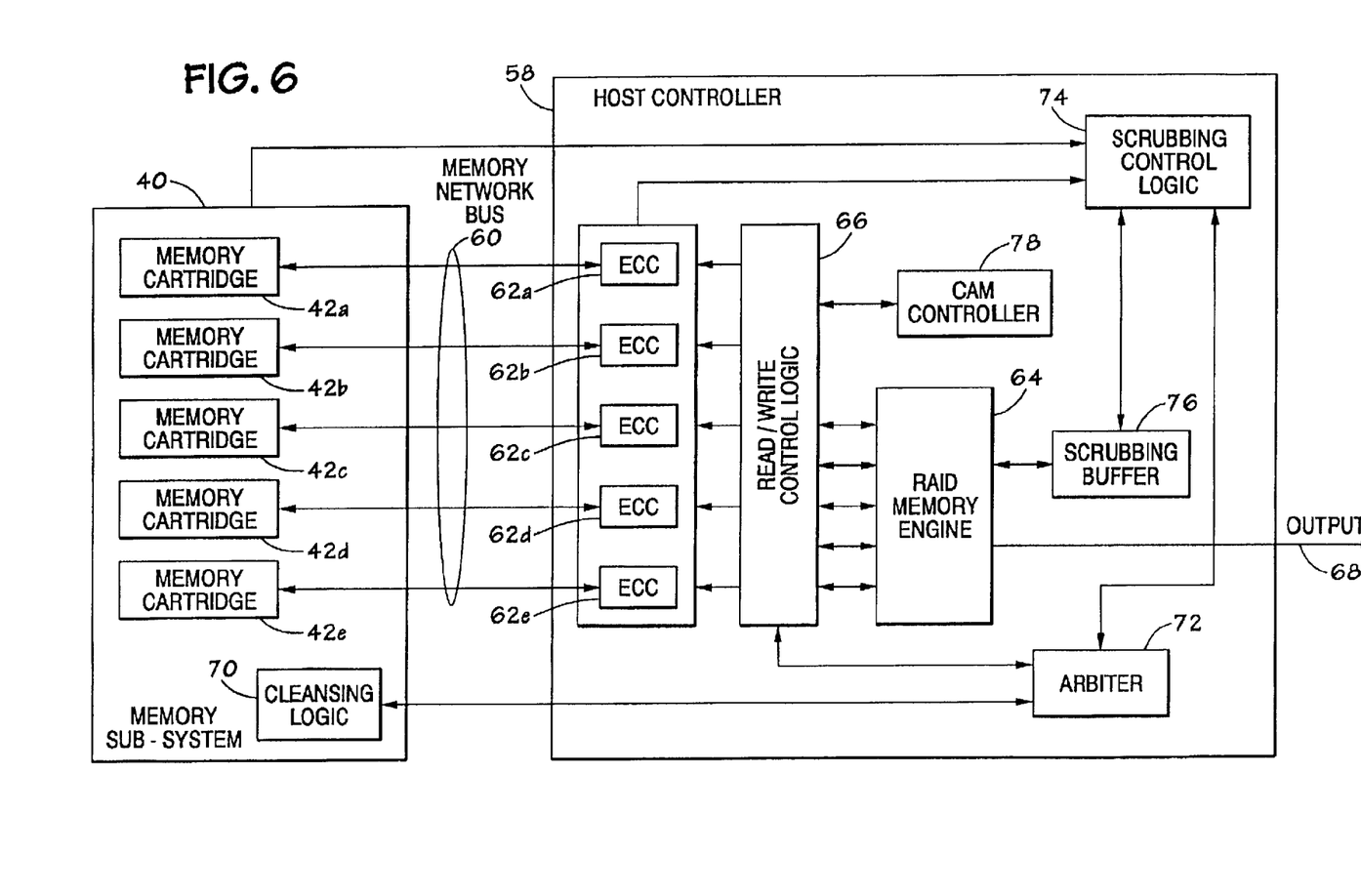
FIG. 6 is a block diagram illustrating an exemplary architecture associated with a computer system in accordance with the present technique.

FIG. 6 is a block diagram illustrating one embodiment of the cleansing technique which incorporates the RAID memory architecture. As previously described, a computer system includes a memory sub-system 40 comprising memory cartridges 42a–e. As described with reference to FIG. 5, each memory cartridge 42a–e may include a memory control device 48a–e (shown in FIG. 5). Thus, to access the memory devices 46 (shown in FIG. 5) in memory cartridge 42a, a READ command is issued and data is passed through the memory control device 48a, and so forth.

Each memory control device 48a–e may comprise ECC fault tolerance capability. As data is passed from the memory sub-system 40 to the host controller 58 via a memory network bus 60, each data word being produced by a memory cartridge 42a–e is checked for single bit memory errors in each respective memory control device 48a–e (residing on each respective memory cartridge 42a–e) by typical ECC methods. If no errors are detected, the data is simply passed to the host controller 58 and eventually to a requesting device via an OUTPUT 68. If a single-bit error is detected by a memory control device 48*a–e*, the data is corrected by the memory control device 48*a–e*. When the corrected data is sent to the host controller 58 via the memory network bus 60, error detection and correction devices 62*a–e*, which reside in the first controller 58 and may be identical to the ECC devices in the memory control devices 48*a–e*, will not detect any erroneous data words since the single-bit errors have been corrected by the memory control devices 48*a–e* in the memory sub-system 40. Therefore, if an error is detected and corrected by the memory control devices 48*a–e*, a message is sent from the memory control devices 48 are to the host controller 58 indicating that a memory error has been detected and corrected and that the corresponding memory cartridge 42*a–e* should be over-written with corrected data, as discussed in more detail below.

In an alternate embodiment, the error detection capabilities in the memory control devices 48*a–e* may be turned off or eliminated. Because the host controller 58 also includes error detection and correction devices 62*a–e*, any single bit errors can still be corrected using the standard ECC methods available in the host controller 58. Further, it is possible that errors may be injected while the data is on the memory network bus 60. In this instance, even if the error detection capabilities are turned on in the memory control devices 48*a–e*, the memory control devices 48*a–e* will not detect an error since the error is injected after the data has passed from the memory sub-system 40. Advantageously, since the host controller 58 includes similar or even identical error detection and correction devices 62*a–e*, the errors can be detected and corrected in the host controller 58.

If a multi-bit error is detected in one of the memory control devices 48*a–e*, the memory control device 48*a–e*, with standard ECC capabilities, can detect the errors but will not be able to correct the data error. Therefore, the erroneous data is passed to the error detection and correction devices 62*a–e*. Like the memory control devices 48*a–e*, the error detection and correction devices 62*a–e*, which also have typical ECC detection, can only detect but not correct the multi-bit errors. The erroneous data words may be passed to the RAID memory engine 64 via some READ/WRITE control logic 66, for correction.

In a typical memory READ operation, the host controller 58 will issue a READ command on the memory network bus 60, the READ command originating from an external device such as a disk drive. The memory control devices 48*a–e* receive the request and retrieve the data from the corresponding memory cartridge 42*a–e*. The data is then passed from the memory sub-system 40 to the host controller 58. As described above, single-bit errors may either be corrected in the memory control devices 48*a–e* or the detection and correction devices 62*a–e*. The RAID memory engine 64 will correct the multi-bit errors, as described above. The corrected data will be delivered from the host controller 58 to the requesting controller or I/O device via an OUTPUT 68.

It should be evident from the discussion above, that performing error detection and correction on data residing in the memory sub-system 40 by relying on READ operations sent from peripheral devices will only result in detection of errors on those devices from which data is read. By relying on the READ command from a peripheral device, certain areas of memory may sit idle for extended periods thereby allowing data errors to accumulate undetected. To address this issue, an additional piece of logic may reside in the memory sub-system 40. The cleansing logic 70 initiates a routine based on an operator instruction, a pre-determined periodic instruction, or some sequence of events such as a hot-plug event, for example. The cleansing logic 70 initiates a check of the specified memory location in the memory sub-system 40 without depending on normal READ accesses by external devices.

The cleansing logic 70 initiates a cleansing procedure through an arbiter 72 in the host controller 58. The arbiter 72 is generally responsible for prioritizing accesses to the memory sub-system 40. A queue comprises a plurality of requests such as memory READ, memory WRITE, memory cleansing, and memory scrubs (discussed further below), for example. The arbiter 72 prioritizes the requests and otherwise manages the queue. The cleansing logic 70 essentially initiates its own internal READ command to check specified regions of the memory sub-system 40. Once the cleansing logic 70 initiates a request to the arbiter 72, the cleansing procedure is scheduled in the queue. The request will pass through the READ/WRITE control logic 66 and to the memory sub-system 40. The specified memory locations in the memory sub-system 40 will be read and any errors will be detected and/or corrected by the means described above with reference to the READ command issued by a peripheral device. The cleansing procedure implemented by the cleansing logic 70 can be initiated in a variety of ways. For instance, a user may be able to check specified memory locations by pulling up a window on an operating system. The window may allow a user to specify what locations in memory the user would like checked. By providing a user with the ability to check specified memory locations, the cleansing procedure provides user confidence in the validity of data stored in the memory sub-system 40.

Alternately, the cleansing procedure may be a periodically scheduled event. In this instance, the cleansing logic 70 may include a timer and a buffer for storing a list of each address location in the memory sub-system 40. At programmed or specified time intervals, the cleansing logic 70 may initiate READ commands to the arbiter 72 to cleanse the data stored in the corresponding address locations in the memory sub-system 40. The cleansing logic 70 may initiate READ commands through successive addresses in the memory sub-system 40 such that every memory address is eventually checked. The cleansing logic 70 thus may insure that all address locations in the memory sub-system 40 or a specified set of address locations are periodically checked for validity. Furthermore, the READ command issued by the cleansing logic 70 may be scheduled as a low priority thread in the arbiter 72 to minimize system impact. In this way, the cleansing procedure may only be run during periods of low system activity (e.g. when the queue in the arbiter 72 does not include READ/WRITE requests from external devices).

To this point, error detection via peripheral READ commands and READ commands implemented by the cleansing logic 70 have been discussed. The memory control devices 48*a–e*, the error detection and correction devices 62*a–e* and the RAID memory engine 64 can be used to correct the data before it is written to the output 68. However, at this point the data residing in the memory sub-system 40 may still be corrupted. To rectify this problem, the data in the memory sub-system 40 may be overwritten or "scrubbed." For every data word in which a single bit error is detected and flagged by the memory control devices 48*a–e* or the error detection and correction devices 62*a–e*, a request is sent to the scrubbing control logic 74 indicating that the corresponding memory location should be scrubbed during a subsequent WRITE operation initiated by the scrubbing control logic 74. Similarly, if a multi-bit error is detected by the error detection and correction devices 62a–e, the data is corrected through the RAID memory engine 64, and the scrubbing control logic 74 is notified by the corresponding error detection and correction device 62a-e that the corresponding memory location in the memory sub-system 40 should be scrubbed. If a single-bit error is detected in one of the memory control devices 48a-e, or a multi-bit error is detected in one of the error detection and correction devices 62a-e a message is sent to the scrubbing control logic 74 indicating that an erroneous data word has been detected. At this time, the corrected data word and corresponding address location are sent from the RAID memory engine 64 to a buffer 76 which is associated with the scrubbing process. The buffer 76 is used to store the corrected data and corresponding address location temporarily until such time that the scrubbing process can be implemented. Once the scrubbing control logic 74 receives an indicator that a corrupted data word has been detected and should be corrected in the memory sub-system 40, a request is sent to the arbiter 72 which schedules and facilitates all accesses to the memory sub-system 40. To insure proper timing and data control, each time a data word is rewritten back to the memory sub-system 40, an entire cache line may be rewritten into each of the corresponding memory cartridges 42a-e in the subsystem 40 rather than just rewriting the erroneous data word. The scrubbing logic can be used to rewrite the locations in the memory sub-system 40 when errors are found during a typical READ operation or a cleansing procedure initiated by the verify logic 70.

Further, the host controller 58 may include a content addressable memory (CAM) controller 78. The CAM controller 78 provides a means of insuring that memory WRITEs are only performed when necessary. Because many READ and WRITE requests are active at any given time on the memory network bus 60 and because a scrubbing operation to correct corrupted data may be scheduled after a WRITE to the same memory location, the CAM controller 78 will compare all outstanding WRITE requests to subsequent memory scrub requests which are currently scheduled in the queue. It is possible that a corrupted memory location in the memory sub-system 40 which has a data scrub request waiting in the queue may be overwritten with new data prior to the scrubbing operation to correct the old data previously present in the memory sub-system 40. In this case, the CAM controller 78 will recognize that new data has been written to the address location in the memory sub-system 40 by implementing a simple compare function between the addresses and will cancel the scheduled scrubbing operation. The CAM controller 78 will insure that the old corrected data does not over-write new data which has been stored in the corresponding address location in the memory sub-system 40.

It should be noted that the error detection and scrubbing technique described herein may not distinguish between soft and hard errors. While corrected data may still be distributed through the output of the host controller 58, if the errors are hard errors, the scrubbing operation to correct the erroneous data words in the memory sub-system 40 will be unsuccessful. To solve this problem, software in the host controller 58 may track the number of data errors associated with a particular data word or memory location. After some predetermined number of repeated errors are detected in the same data word or memory location, the host controller 58 may send an error message to a user or illuminate an LED corresponding to the device in which the repeat error is detected.

Returning to the discussion of the cleansing logic 70, there may be a disadvantage to implementing periodically scheduled READ commands through the cleansing logic 70. During periods of heavy memory sub-system 40 utilization, preventative memory cleansing may disadvantageously slow the completion of more critical events such as memory READs and WRITEs. To address this issue, an additional component may be implemented in the present system, as discussed below with reference to FIG. 7.

Figure 7:
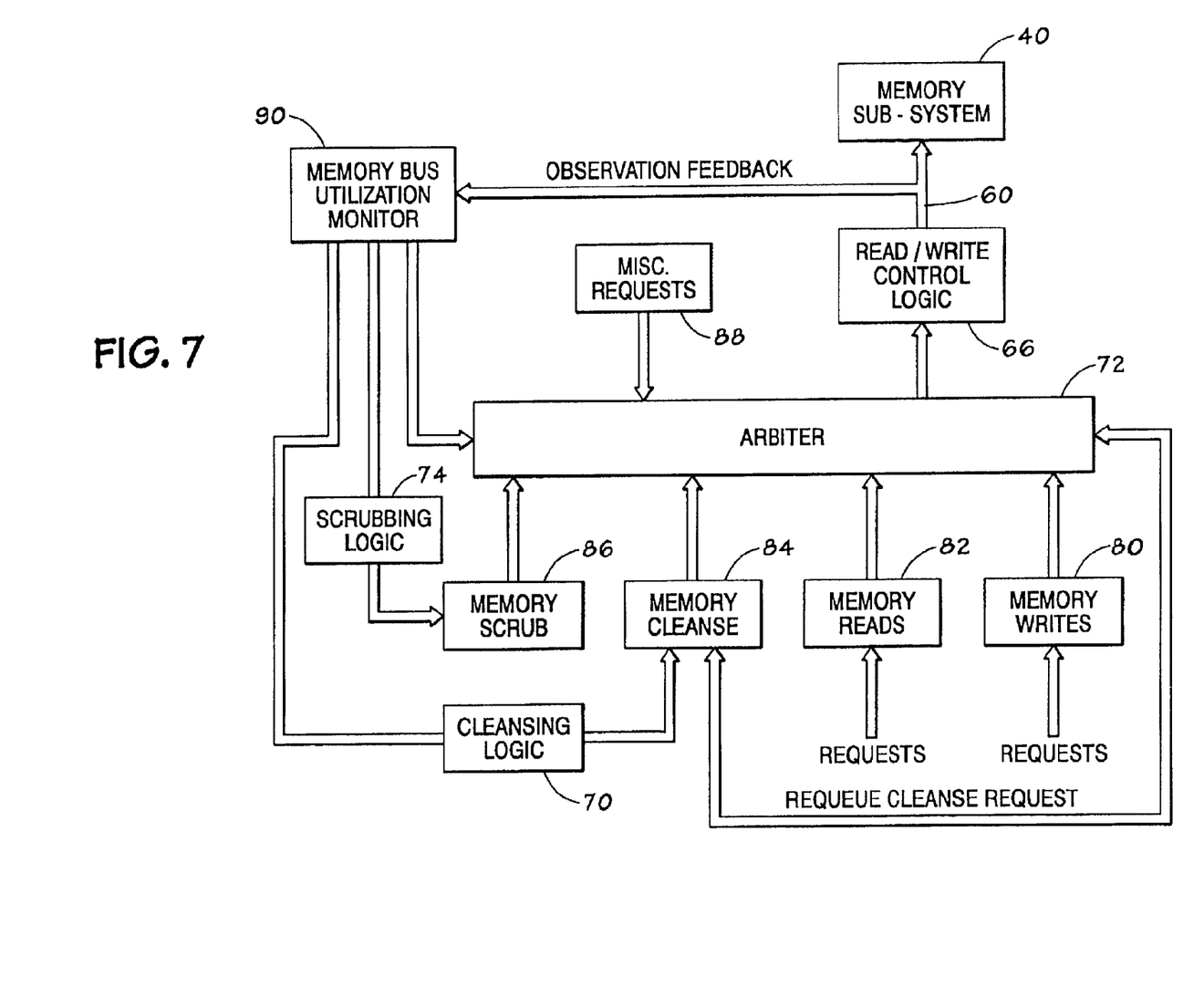
FIG. 7 is a block diagram illustrating the memory cleansing techniques in accordance with the present system.

FIG. 7 is a block diagram illustrating the present cleansing system, along with a component to monitor the memory sub-system and modify the memory cleansing and subsequent scrubbing frequency. As previously discussed, the arbiter 72 is responsible for receiving and prioritizing requests, such as WRITE requests 80, READ requests 82, cleansing requests 84, scrub requests 86 and other miscellaneous requests 88 (such as memory refresh, interrupts, hot-plug verify procedures, etc.). The Memory Bus Utilization Monitor (MBUM) 90 monitors the activity on the memory network bus 60, and provides feedback to the arbiter 72, the memory cleansing logic 70, and the scrubbing control logic 74, thereby allowing re-scheduling of less critical events. The MBUM 90 functions as a feedback mechanism for the arbiter 72. Since the MBUM 90 monitors the memory network bus, the MBUM 90 has the ability to serve as a modulator and may increase or decrease the frequency of the memory cleansing requests 84 and the memory scrub requests 86.

To perform the rescheduling functions, the MBUM 90 may include a set of registers that monitor the various types of bus cycles that are run on the system memory (i.e., those corresponding to the various requests to the arbiter 72). The registers perform continuous arithmetic averaging, one specific to each of the types of memory cycles (READ, WRITE, cleanse, etc.) that may be initiated, as well as an additional register that averages the overall available memory bus utilization. The data contained in these registers represent maximum threshold levels that may be referenced to a specified period in time. As a result, these registers comprise activity histograms that may be used to dynamically control the number of cleanse requests 84 and associated scrub requests 86 allowed to run on the memory network bus 60.

Figure 8:
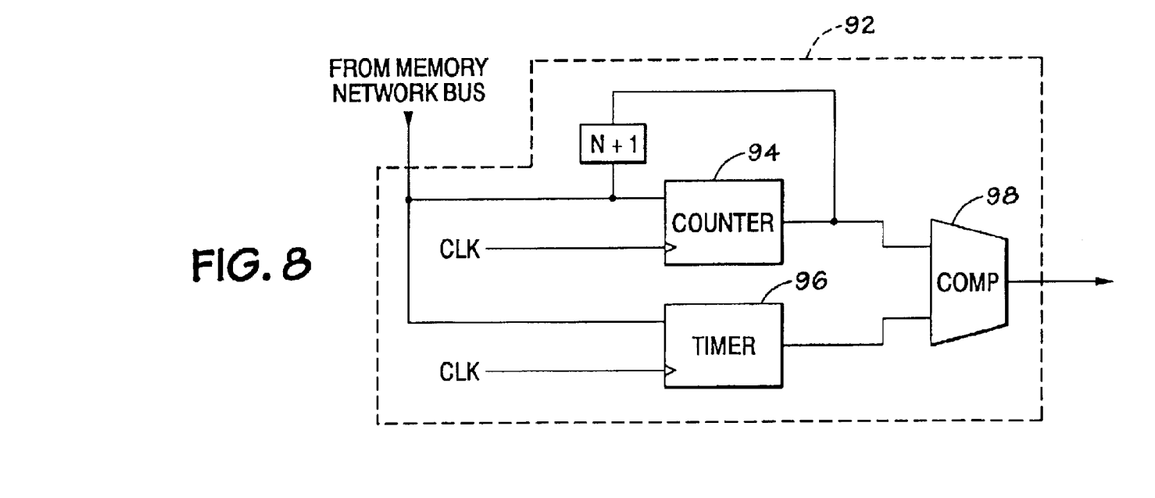
FIG. 8 is a block diagram illustrating one embodiment of a bus memory utilization monitor in accordance with the present technique.

FIG. 8 illustrates one implementation of the MBUM 90. For each request type, as well as the overall system monitor, a register 92 is provided. The register 92 may include a counter 94 and a timer 96. The counter 94 and the timer 96 may comprise DQ flip-flops. For each clock cycle CLK, a check of the memory network bus 60 is made. If a request matching the request type that a particular register 92 is monitoring is detected, the counter 94 will increment by 1. The timer 96 provides a programmable period of discrete time over which the memory network bus 60 is monitored. A comparator 98 may be used to track whether the expiration of the timer 96. Upon expiration of the timer 96, the number of cycles detected may be delivered to the arbiter 72. If the number of cycles detected exceeds a predetermined level, the number of memory cleanse requests 84 and memory scrub requests 86 may be reduced. Conversely, if the number of cycles detected is less than a predetermined level, the number of memory cleanse requests 84 and memory scrub requests 86 may be reduced.

To implement re-programmable timers 96, the system software drivers may be given access to the information tracked by the counters 94. The software may then use the information to program/re-program the reference timers 96 that are used for sample comparison purposes. The memory subsystem 40 activities can then be tuned and modified during run-time. Based on sufficient monitoring time history, clear patterns of utilization may be observable, and the software drivers may be able to "predict" when sufficient memory bandwidth will be available to support an increase in the number of memory cleanse requests 84 and memory scrub requests 86 that are ran in the background without being concerned that the additional activity might affect available memory bandwidth.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A system for detecting errors in a memory device, the system comprising:
   a memory sub-system comprising:
   a plurality of memory cartridges configured to store data words;
   a cleansing device configured to periodically initiate an internal READ command to the plurality of memory cartridges in response to an event, the internal READ command being issued to the plurality of memory cartridges on a memory network bus; and
   a monitoring device configured to monitor the memory network bus and further configured to change the frequency of periodic initiations of the internal READ commands based on the number of requests on the memory network bus over a period of time; and
   a host controller operably coupled to the memory sub-system and comprising error detection logic configured to detect errors in a data word which has been read from the plurality of memory cartridges.

2. The system for detecting errors in a memory device, as set forth in claim 1, wherein each of the plurality of memory cartridges comprises a plurality of memory modules.

3. The system for detecting errors in a memory device, as set forth in claim 2, wherein each of the plurality of memory modules comprises a Dual Inline Memory Module (DIMM).

4. The system for detecting errors in a memory device, as set forth in claim 2, wherein each of the plurality of memory modules comprises a plurality of memory devices configured to store data words.

5. The system for detecting errors in a memory device, as set forth in claim 4, wherein each of the plurality of memory devices comprises a Synchronous Dynamic Random Access Memory (SDRAM) device.

6. The system for detecting errors in a memory device, as set forth in claim 1, wherein the memory sub-system comprises five memory modules.

7. The system for detecting errors in a memory device, as set forth in claim 1, wherein each of the plurality of memory cartridges comprises a memory control device configured to control access to one of the plurality of memory cartridges.

8. The system for detecting errors in a memory device, as set forth in claim 7, wherein each of the memory control devices comprises error detection logic configured to detect errors in a data word which has been read from the plurality of memory cartridges.

9. The system for detecting errors in a memory device, as set forth in claim 1, wherein the memory controller comprises error detection logic configured to detect errors in a data word during a READ operation.

10. The system for detecting errors in a memory device, as set forth in claim 1, wherein the event comprises an operator instruction.

11. The system for detecting errors in a memory device, as set forth in claim 1, wherein the event comprises the expiration of a timer.

12. The system for detecting errors in a memory device, as set forth in claim 1, wherein the error detection logic comprises Error Code Correction (ECC) logic.

13. The system for detecting errors in a memory device, as set forth in claim 1, wherein the host controller comprises an arbiter configured to schedule accesses to the memory sub-system.

14. The system for detecting errors in a memory device, as set forth in claim 1, wherein the cleansing device is configured to request an internal READ command in the arbiter.

15. The system for detecting errors in a memory device, as set forth in claim 14, wherein the monitoring device is coupled to the cleansing device.

16. The system for detecting errors in a memory device, as set forth in claim 14, wherein the monitoring device is coupled to the arbiter.

17. The system for detecting errors in a memory device, as set forth in claim 16, wherein the monitoring device comprises a plurality of counters configured to count the number of requests are issued to the arbiter.

18. The system for detecting errors in a memory device, as set forth in claim 17, wherein the monitoring device comprises a plurality of timers configured to provide a discrete time period over which the plurality of counters count the number of requests to the arbiter.

19. The system for detecting errors in a memory device, as set forth in claim 18, wherein the number of requests to the arbiter are changed in response to the number of requests counted by the plurality of counters.

20. The system for detecting errors in a memory device, as set forth in claim 19, wherein the requests comprise memory cleansing requests.

21. A memory sub-system comprising:
   a plurality of memory cartridges configured to store data words;
   a cleansing device configured to periodically initiate an internal READ command to the plurality of memory cartridges in response to an event, the internal READ command being issued to the plurality of memory cartridges on a memory network bus; and
   a monitoring device configured to monitor the memory network bus and further configured to change the frequency of periodic initiations of the internal READ commands based on the number of requests on the memory network bus over a period of time.

22. The memory sub-system, as set forth in claim 21, wherein each of the plurality of memory cartridges comprises a plurality of memory modules.

23. The memory sub-system, as set forth in claim 22, wherein each of the plurality of memory modules comprises a Dual Inline Memory Module (DIMM).

24. The memory sub-system, as set forth in claim 22, wherein each of the plurality of memory modules comprises a plurality of memory devices configured to store data words.

25. The memory sub-system, as set forth in claim 24, wherein each of the plurality of memory devices comprises a Synchronous Dynamic Random Access Memory (SDRAM) device.

26. The memory sub-system, as set forth in claim 21, wherein the memory sub-system comprises five memory modules.

27. The memory sub-system, as set forth in claim 21, wherein each of the plurality of memory cartridges comprises a memory control device configured to control access to one of the plurality of memory cartridges.

28. The memory sub-system, as set forth in claim 27, wherein each of the memory control devices comprises error detection logic configured to detect errors in a data word which has been read from the plurality of memory cartridges.

29. The memory sub-system, as set forth in claim 21, wherein the memory controller comprises error detection logic configured to detect errors in a data word during a READ operation.

30. The memory sub-system, as set forth in claim 21, wherein the event comprises an operator instruction.

31. The memory sub-system, as set forth in claim 21, wherein the event comprises the expiration of a timer.

32. The memory sub-system, as set forth in claim 21, wherein the cleansing device is configured to request an internal READ command to an arbiter, the arbiter configured to schedule accesses to the memory sub-system.

33. The memory sub-system, as set forth in claim 21, wherein the monitoring device is coupled to the cleansing device.

34. The memory sub-system, as set forth in claim 32, wherein the monitoring device is coupled to the arbiter.

35. The memory sub-system, as set forth in claim 34, wherein the monitoring device comprises a plurality of counters configured to count the number of requests are issued to the arbiter.

36. The memory sub-system, as set forth in claim 35, wherein the monitoring device comprises a plurality of timers configured to provide a discrete time period over which the plurality of counters count the number of requests to the arbiter.

37. The memory sub-system, as set forth in claim 36, wherein the number of requests to the arbiter are changed in response to the number of requests counted by the plurality of counters.

38. The memory sub-system, as set forth in claim 37, wherein the requests comprise memory cleansing requests.

39. A system for correcting errors detected in a memory device, the system comprising:
a memory sub-system comprising:
a plurality of memory cartridges configured to store data words;
a cleansing device configured to periodically initiate an internal READ command to the plurality of memory cartridges in response to an event, the internal READ command being issued to the plurality of memory cartridges on a memory network bus; and
a monitoring device configured to monitor the memory network bus and further configured to change the frequency of periodic initiations of the internal READ commands based on the number of requests on the memory network bus over a period of time; and
a host controller operably coupled to the memory sub-system and comprising:
an arbiter configured to schedule accesses to the memory sub-system;
error detection logic configured to detect errors in a data word which has been read from the plurality of memory cartridges;
a memory engine configured to correct the errors detected in the data word which has been read from the plurality of memory cartridges in response to the internal READ command initiated by the cleansing device and configured to produce a corrected data word corresponding to the data word in which an error has been detected;
scrubbing control logic configured to request a write-back to each memory location in which the error detection logic has detected an error in a data word which has been read from the memory sub-system; and
one or more memory buffers configured to store the corrected data word.

40. The system for correcting errors detected in a memory device, as set forth in claim 39, wherein each of the plurality of memory cartridges comprises a plurality of memory modules.

41. The system for correcting errors detected in a memory device, as set forth in claim 40, wherein each of the plurality of memory modules comprises a Dual Inline Memory Module (DIMM).

42. The system for correcting errors detected in a memory device, as set forth in claim 40, wherein each of the plurality of memory modules comprises a plurality of memory devices configured to store data words.

43. The system for correcting errors detected in a memory device, as set forth in claim 39, wherein each of the plurality of memory devices comprises a Synchronous Dynamic Random Access Memory (SDRAM) device.

44. The system for correcting errors detected in a memory device, as set forth in claim 39, wherein the memory sub-system comprises five memory modules.

45. The system for correcting errors detected in a memory device, as set forth in claim 39, wherein each of the plurality of memory cartridges comprises memory control device configured to control access to one of the plurality of memory cartridges.

46. The system for correcting errors detected in a memory device, as set forth in claim 45, wherein each of the memory control devices comprises error detection logic configured to detect errors in a data word which has been read from the plurality of memory cartridges.

47. The system for correcting errors detected in a memory device, as set forth in claim 39, wherein the memory controller comprises error detection logic configured to detect errors in a data word during a READ operation.

48. The system for correcting errors detected in a memory device, as set forth in claim 39, wherein the event comprises an operator instruction.

49. The system for correcting errors detected in a memory device, as set forth in claim 39, wherein the event comprises the expiration of a timer.

50. The system for correcting errors detected in a memory device, as set forth in claim 39, wherein the cleansing device is configured to request an internal READ command in the arbiter.

51. The system for correcting errors detected in a memory device, as set forth in claim 39, wherein the error detection logic comprises Error Code Correction (ECC) logic.

52. The system for correcting errors detected in a memory device, as set forth in claim 39, wherein the host controller comprises an arbiter configured to schedule accesses to the memory sub-system.

53. The system for correcting errors detected in a memory device, as set forth in claim 39, wherein the memory engine comprises a Redundant Array of Industry Standard Dynamic Integrated Memory Modules (RAID) memory engine configure to detect and correct failures in a memory device.

54. The system for correcting errors detected in a memory device, as set forth in claim 39, wherein the host controller comprises one or more logic devices configured to deliver a scrub request to the arbiter.

55. The system for correcting errors detected in a memory device, as set forth in claim 54, wherein the arbiter is configured to schedule a scrub of the address location corresponding to the data word in which an error is detected.

56. The system for correcting errors detected in a memory device, as set forth in claim 55, comprising a Content Addressable Memory (CAM) controller configured to compare outstanding WRITE requests in the queue of the arbiter with outstanding scrub requests in the queue of the arbiter.

57. The system for correcting errors detected in a memory device, as set forth in claim 56, wherein the scrub request is canceled if an address location of a scrub request contained in the queue is the same as the address location of one of the WRITE requests scheduled prior to the scrub request in the queue.

58. The system for correcting errors detected in a memory device, as set forth in claim 39, wherein the cleansing device is configured to request an internal READ command the arbiter.

59. The system for correcting errors detected in a memory device, as set forth in claim 39, wherein the monitoring device is coupled to the cleansing device.

60. The system for correcting errors detected in a memory device, as set forth in claim 58, wherein the monitoring device is coupled to the arbiter.

61. The system for correcting errors detected in a memory device, as set forth in claim 58, wherein the monitoring device is coupled to the scrubbing control logic.

62. The system for correcting errors detected in a memory device, as set forth in claim 61, wherein the monitoring device comprises a plurality of counters configured to count the number of requests are issued to the arbiter.

63. The system for correcting errors detected in a memory device, as set forth in claim 62, wherein the monitoring device comprises a plurality of timers configured to provide a discrete time period over which the plurality of counters count the number of requests to the arbiter.

64. The system for correcting errors detected in a memory device, as set forth in claim 63, wherein the number of requests to the arbiter are changed in response to the number of requests counted by the plurality of counters.

65. The system for correcting errors detected in a memory device, as set forth in claim 64, wherein the requests comprise memory cleansing requests.

66. The system for correcting errors detected in a memory device, as set forth in claim 64, wherein the requests comprise memory scrub requests.

67. A method for dynamically scheduling access to a memory sub-system, comprising the acts of:
(a) monitoring activity on a memory bus configured to provide access to the memory sub-system; and
(b) periodically initiating internal READ commands from a cleansing device in the memory sub-system, wherein the period between initiating each READ command is dependent on the activity on the memory bus and wherein the cleansing device is configured to periodically initiate the internal READ commands.

68. The method for dynamically scheduling access to a memory sub-system, as set forth in claim 67, wherein the activity comprises a plurality of memory requests.

69. The method for dynamically scheduling access to a memory sub-system, as set forth in claim 68, wherein the act of monitoring activity on the memory bus is performed by a Memory Bus Utilization Monitor (MBUM).

70. The method for dynamically scheduling access to a memory sub-system, as set forth in claim 69, wherein the MBUM comprises a plurality of counters configured to count the number of requests on the memory bus over a length of time.

71. The method for dynamically scheduling access to a memory sub-system, as set forth in claim 70, wherein the MBUM comprises a plurality timers coupled to the plurality of counters and configured to set the length of time over which the plurality of counters are configured to count the number of requests on the memory bus.

72. The method for dynamically scheduling access to a memory sub-system, as set forth in claim 71, wherein the number of requests determined by the plurality of counters over the length of time set by the plurality of timers, is compared to a threshold.

73. The method for dynamically scheduling access to a memory sub-system, as set forth in claim 72, wherein the period between initiating each REAR command is increased if the number of requests determined by the plurality of counters is greater than the threshold.

74. The method for dynamically scheduling access to a memory sub-system, as set forth in claim 72, wherein the period between initiating each READ command is decreased if the number of requests determined by the plurality of counters is less than the threshold.

75. The method for dynamically scheduling access to a memory sub-system, as set forth in claim 67, wherein the internal READ command is a cleansing operation request.

76. The method for dynamically scheduling access to a memory sub-system, as set forth in claim 67, further comprising the acts of:
transmitting a first set of data corresponding to the address issued in the internal READ command, from the memory sub-system to a host-controller;
detecting errors in the first set of data; and
producing a second set of data from the fist set of data, wherein the second set of data comprises corrected data and corresponds to the address in the first set of data.

77. The method for dynamically scheduling access to a memory sub-system, as set forth in claim 76, comprising the acts of:
storing the second set of data and corresponding address in a temporary storage device;
scheduling a scrub of the address corresponding to the second set of data; and
writing the second set of data to the corresponding address location to replace the first set of data in the memory sub-system.

78. The method for dynamically scheduling access to a system, as set forth in claim 77, wherein the memory sub-system comprises a plurality of memory cartridges.

79. The method for dynamically scheduling access to a memory sub-system, as set forth in claim 78, wherein each of the plurality of memory cartridges comprises a plurality of memory modules.

80. The method for dynamically scheduling access to a memory sub-system, as set forth in claim 79, wherein each of the plurality of memory modules comprises a plurality of memory devices configured to store data words.

81. The method for dynamically scheduling access to a memory sub-system, as set forth in claim 80, wherein each of the plurality of memory cartridges, comprises a corresponding memory control device.

82. The method for dynamically scheduling access to a memory sub-system, as set forth in claim 81, wherein the memory controller comprises a plurality of memory control devices, each of the plurality of memory control devices corresponding to one of the plurality of memory cartridges.

83. The method for dynamically scheduling access to a memory sub-system, as set forth in claim 76, wherein act (b) comprises the act of using ECC methods to detect errors in the set of data.

84. The method for dynamically scheduling access to a memory sub-system, as set forth in claim 76, wherein act (c) comprises the act of correcting the errors detected in the first set of data using a Redundant Array of Industry Standard Dual Inline Memory Modules (RAID) memory engine configured to detect and correct failures in a memory device.

85. The method for dynamically scheduling access to a memory sub-system, as set forth in claim 84, wherein the second set of data is produced by the RAID memory engine.

* * * * *

UNITED STATES PATENT AND TRADEMARK OFFICE
CERTIFICATE OF CORRECTION

PATENT NO. : 6,845,472 B2  Page 1 of 1
APPLICATION NO. : 09/769956
DATED : January 18, 2005
INVENTOR(S) : William J. Walker et al.

It is certified that error appears in the above-identified patent and that said Letters Patent is hereby corrected as shown below:

In column 3, line 32, delete "Pentium HI Xeon" and insert -- Pentium II Xeon --, therefor.

In column 4, line 11, after "interface" delete "121." and insert -- 21. --, therefor.

In column 6, line 7, after "cartridge" delete "44a" and insert -- 42a --, therefor.

In column 6, line 20, after "cartridge" delete "44a" and insert -- 42a --, therefor.

In column 11, line 4, delete "ran" and insert -- run --, therefor.

In column 14, line 30, in Claim 45, after "comprises" insert -- a --.

In column 16, line 16, in Claim 73, delete "REAR" and insert -- READ --, therefor.

In column 16, lines 48-49, in Claim 78, delete "to a system" and insert -- to a memory sub-system --, therefor.

Signed and Sealed this

Twenty-second Day of December, 2009

David J. Kappos
*Director of the United States Patent and Trademark Office*